United States Patent
Kim et al.

(10) Patent No.: US 7,577,050 B2
(45) Date of Patent: Aug. 18, 2009

(54) SEMICONDUCTOR MEMORY DEVICE FOR MEASURING INTERNAL VOLTAGE

(75) Inventors: Ki-Ho Kim, Kyoungki-do (KR); Seok-Cheol Yoon, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 11/529,262

(22) Filed: Sep. 29, 2006

(65) Prior Publication Data

US 2007/0070741 A1   Mar. 29, 2007

(30) Foreign Application Priority Data

Sep. 29, 2005   (KR) .................. 10-2005-0091595
May 17, 2006   (KR) .................. 10-2006-0044162

(51) Int. Cl.
*G11C 7/00* (2006.01)

(52) U.S. Cl. ........................ 365/201; 365/226
(58) Field of Classification Search ............... 365/201, 365/226

See application file for complete search history.

(56) References Cited

U.S. PATENT DOCUMENTS 5,303,197 A * 4/1994 Miyashita et al. ........... 365/210
6,226,200 B1 * 5/2001 Eguchi et al. ............. 365/185.19
6,549,480 B2 * 4/2003 Hosogane et al. ............ 365/226

FOREIGN PATENT DOCUMENTS

| JP | 05-303889 | 11/1993 |
| JP | 11-3600 | 1/1999 |
| KR | 10-2001-0105564 A | 11/2001 |
| KR | 10-2005-0013741 | 2/2005 |

OTHER PUBLICATIONS

Korean Office Action issued in Korean Patent Application No. KR 10-2006-0044162, mailed Apr. 23, 2007.
Korean Office Action with English Translation, issued in Korean Patent Application No. KR 10-2006-0044162, issued on Feb. 18, 2008.

* cited by examiner

*Primary Examiner*—Michael T Tran
(74) *Attorney, Agent, or Firm*—Mannava & Kang, P.C.

(57) ABSTRACT

A semiconductor memory device includes a plurality of internal voltage measuring units, each for driving data input from a memory bank to output the data when a test signal is deactivated, and outputting a corresponding one of internal voltages used in the semiconductor memory device when the test signal is activated.

13 Claims, 5 Drawing Sheets

SEMICONDUCTOR MEMORY DEVICE FOR MEASURING INTERNAL VOLTAGE

FIELD OF THE INVENTION

The present invention relates to a semiconductor memory device; and, more particularly, to an internal voltage measuring apparatus using a data output driver in a packaged semiconductor memory device.

DESCRIPTION OF RELATED ART

In the semiconductor industries, packaging technologies of integrated circuits have been continuously developed to meet the miniaturization and package reliability. As the electronic products are miniaturized, high performance is demanded and various technologies are developed and researched to provide high-capacity semiconductor modules. However, with the high integration and high capacity of semiconductor devices, internal circuits become complicated. In addition, the number of internal control signals increases and the internal voltages become higher. Therefore, the kinds of internal voltages to be measured for analyzing the cause of defectives in the memory device in the test step are also increasing.

FIG. 1 is a block diagram of a conventional internal voltage measuring apparatus.

The internal voltages are measured by adding special bonding in packaging. The special bonding is to bond test pads with unused input/output (I/O) pins or balls (dummy pads), or some address pins or balls.

However, when a plurality of dummy pads are specially bonded so as to measure the internal voltages, the specially-bonded pins or balls cannot be used for the original purpose when the address pins or balls are used. Also, if the special bonding is not done in the packaging manufacturing process, the internal voltages cannot be measured.

SUMMARY OF THE INVENTION

It is, therefore, an object of the present invention to provide an internal voltage measuring apparatus that outputs an internal voltage through a data output driver in a packaged semiconductor memory device.

In accordance with an aspect of the present invention, there is provided a semiconductor memory device including a plurality of internal voltage measuring units, each for driving data input from a memory bank to output the data when a test signal is deactivated, and outputting a corresponding one of internal voltages used in the semiconductor memory device when the test signal is activated.

In accordance with another aspect of the present invention, there is provided an internal voltage measuring apparatus of a semiconductor memory device, including: an input/output (I/O) pad; a data output driving unit for pulling up an input voltage to a first voltage level or pulling down the input voltage to a second voltage level in response to logic levels of the data input from a memory bank, and outputting the pulled-up or pull-down voltage to the I/O pad; and a voltage output unit, connected to the data output driving unit, for receiving a first power supply voltage lower than the first voltage level and higher than the second voltage level, and outputting the first power supply voltage to the I/O pad when a test signal is activated.

In accordance with a further aspect of the present invention, there is provided an internal voltage measuring apparatus of a semiconductor memory device, including: an input/output (I/O) pad; a data output driving unit for pulling up an input voltage to a first voltage level or pulling down the input voltage to a second voltage level in response to logic levels of the data input from a memory bank, and outputting the pulled-up or pull-down voltage to the I/O pad; and a voltage output unit, connected to the data output driving unit, for receiving a first power supply voltage lower than the first voltage level and higher than the second voltage level, and outputting the first power supply voltage to the I/O pad when a test signal is activated.

In accordance with a further aspect of the present invention, there is provided an internal voltage measuring apparatus of a semiconductor memory device, including: an input/output (I/O) pad; a data output driving unit for pulling up an input voltage to a first voltage level or pulling down the input voltage to a second voltage level in response to logic levels of data input from a memory bank, and outputting the pull-up or pull-down voltage to the I/O pad; and a voltage output unit, connected to the data output driving unit, for receiving a second power supply voltage higher than the first voltage level, and outputting the second power supply voltage to the I/O pad when a test signal is activated.

Accordingly, the internal voltages can be output even when the data output driving unit does not output the data and the test signal is activated. Moreover, the number of dummy pads can be reduced.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

A multi-port memory device in accordance with exemplary embodiments of the present invention will be described in detail with reference to the accompanying drawings.

Figure 1:
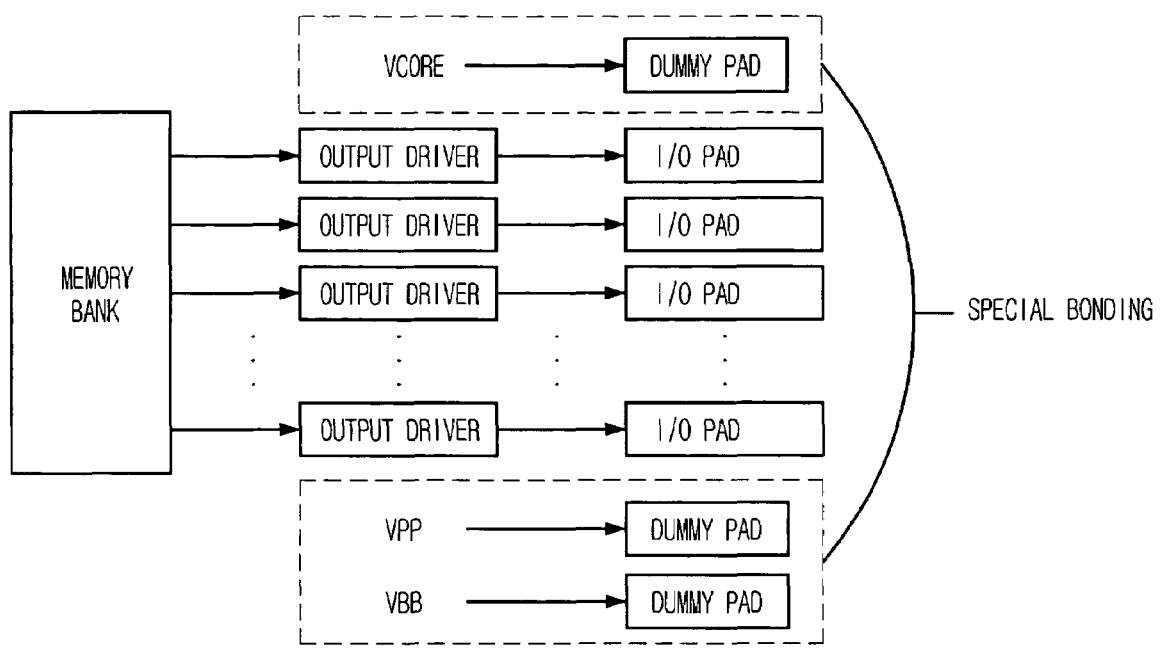
FIG. 1 is a block diagram of a conventional internal voltage measuring apparatus using a data output driver.
Figure 2:
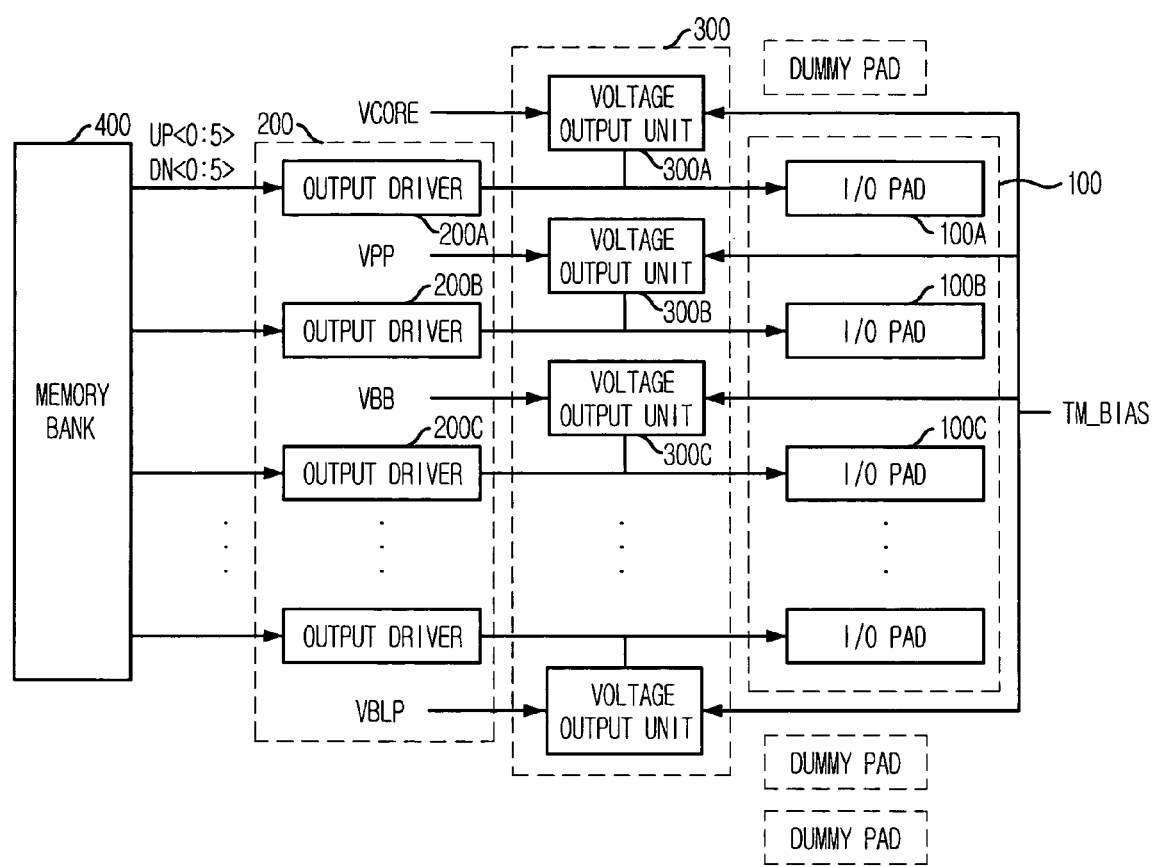
FIG. 2 is a block diagram of an internal voltage measuring apparatus in accordance with an embodiment of the present invention.

FIG. 2 is a block diagram of an internal voltage measuring apparatus in accordance with the present invention.

The internal voltage measuring apparatus includes an input/output (I/O) pad 100, a data output driving unit 200, and a voltage output unit 300. The data output driving unit 200 drives data input from a memory bank 400 to output the data to the I/O pad 100. The voltage output unit 300 is connected to the data output driving unit 200 and generates internal voltages VCORE, VPP, VBB and VBLP used in the memory device to the I/O pad 100 when a test signal TM_BIAS is activated.

In accordance with the present invention, the internal voltages VCORE, VPP, VBB and VBLP are measured by sharing the I/O pad 100 used for outputting data, instead of using additional dummy pads.

When the memory device changes to the test mode in response to the test signal TM_BIAS, the voltage output unit 300 outputs the internal voltages VORE, VPP, VBB and VBLP to the I/O pad 100. On the other hand, when the test signal TM_BIAS is deactivated, the internal voltages are not output.

The test signal TM_BIAS is provided from an external circuit.

In order to measure the internal voltages, the data I/O pads used for inputting/outputting data are shared instead of using special bonding, and the internal voltages are output.

Figure 3:
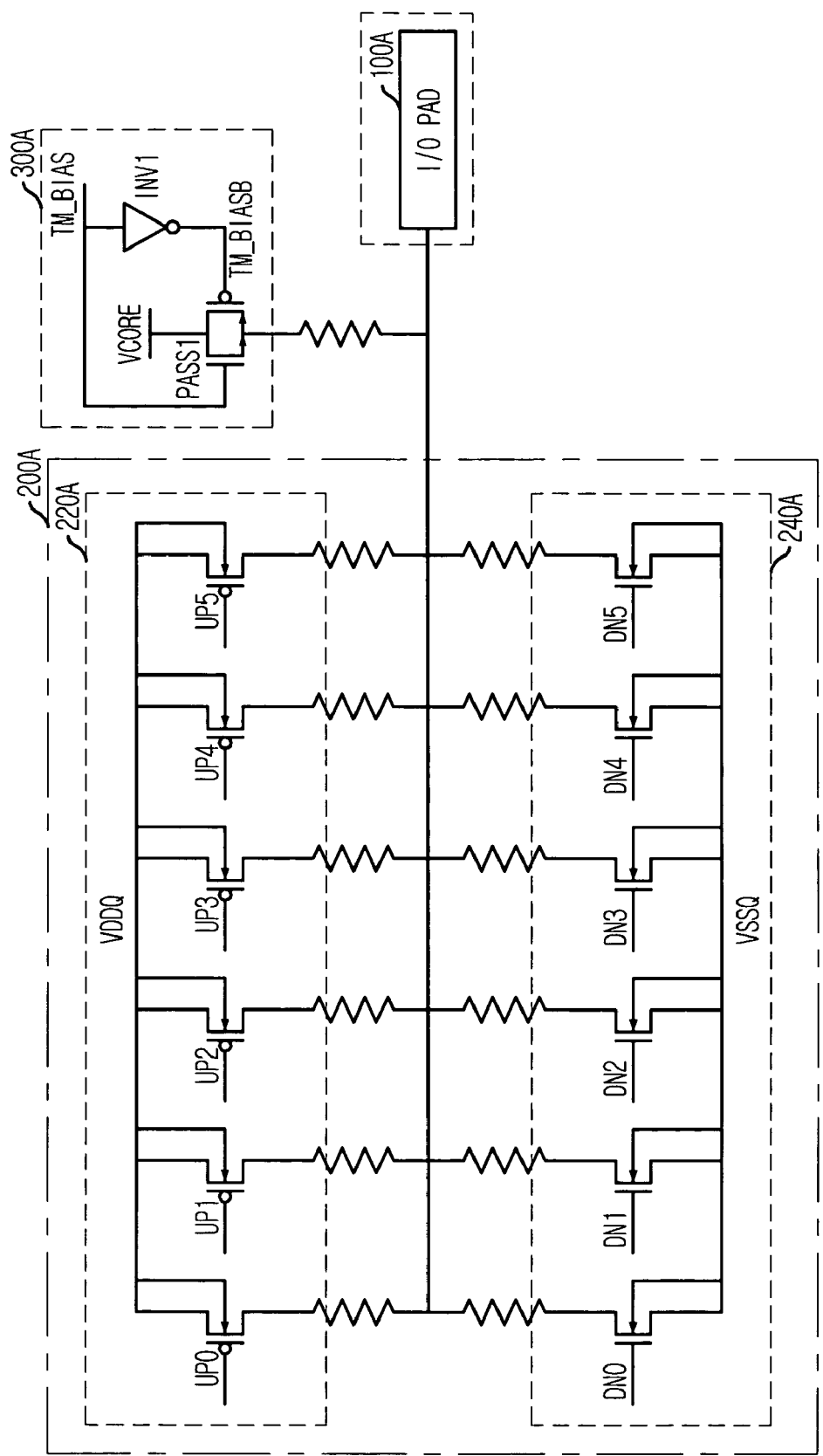
FIG. 3 is a detailed circuit diagram of an internal voltage measuring apparatus in accordance with a first embodiment of the present invention.

FIG. 3 is a detailed circuit diagram of an internal voltage measuring apparatus according to a first embodiment of the present invention.

The internal voltage measuring apparatus includes the I/O pad 100A, the data output driving unit 200A, and the voltage output unit 300A. The data output driving unit 200A includes pull-up transistors 220A for pulling up an input voltage to a first voltage level VDDQ and pull-down transistors 240A for pulling down the input voltage to a second voltage level VSSQ in response to logic levels of the data input from the bank, and outputs the pulled-up or pulled-down voltage to the I/O pad 100A. The voltage output unit 300A connected to the data output driving unit 200A receives a first power supply voltage VCORE lower than the first voltage level VDDQ and higher than the second voltage level VSSQ and outputs it to the I/O pad 100A when the test signal TM_BIAS is activated.

The data output driving unit 200A is driven by the data output driver to output the data stored in the memory bank to the I/O pad. During the read operation, the pull-up transistors 220A have to be turned on so as to output "1" and the pull-down transistors 240A have to be turned on so as to output "0".

The voltage output unit 300A includes an inverter INV1 and a pass gate PASS1. The inverter INV1 inverts a phase of the test signal TM_BIAS to output a test bar signal TM_BIASB. The pass gate PASS1 transfers the first power supply voltage VCORE to the I/O pad 100A in response to the test signal TM_BIAS and the test bar signal TM_BIASB.

Until now, the entire structure of the semiconductor memory device has been described without regard to the internal voltage levels output from the data output driving unit. However, in this embodiment, the internal voltage levels are limited to the range between the external power supply voltage VDDQ and the ground voltage VSSQ.

Figure 4:
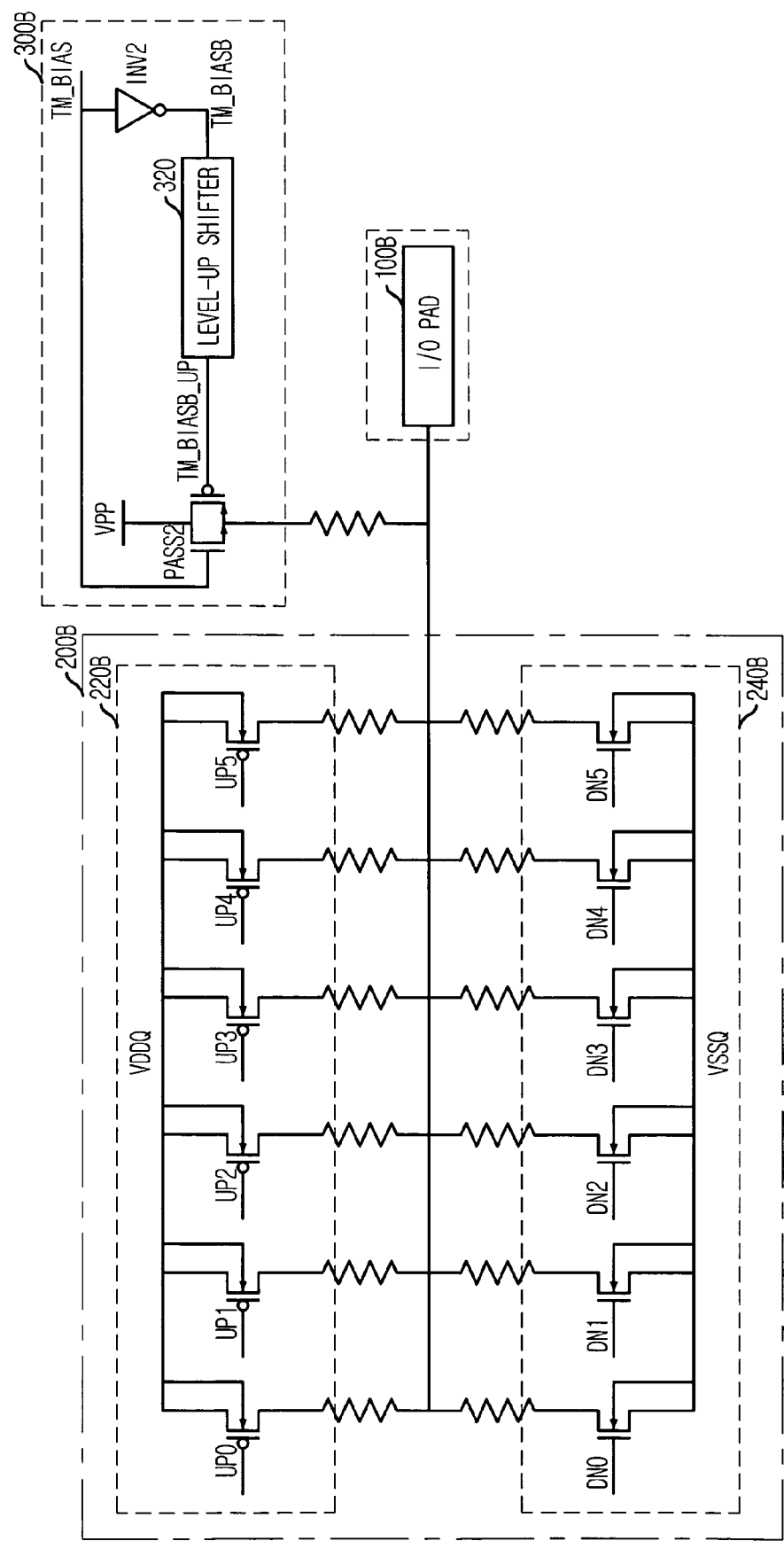
FIG. 4 is a detailed circuit diagram of an internal voltage measuring apparatus in accordance with a second embodiment of the present invention.

FIG. 4 is a detailed circuit diagram of an internal voltage measuring apparatus according to a second embodiment of the present invention.

The internal voltage measuring apparatus includes an I/O pad 100B, a data output driving unit 200B, and a voltage output unit 300B. The data output driving unit 200B includes pull-up transistors 220B for pulling up an input voltage to a first voltage level VDDQ and pull-down transistors 240B for pulling down the input voltage to a second voltage level VSSQ in response to logic levels of the data input from the memory bank, and outputs the pulled-up or pulled-down voltage to the I/O pad 100B. The voltage output unit 300B connected to the data output driving unit 200B receives a second power supply voltage VPP higher than the first voltage level VDDQ and outputs it to the I/O pad 100B when the test signal TM_BIAS is activated.

The test signal TM_BIAS has the first voltage level VDDQ when it is activated, and has the second voltage level VSSQ when it is deactivated.

Since the operation of the data output driving unit 200B is identical to that of the first embodiment of the present invention, its detailed description will be omitted.

The voltage output unit 300B includes an inverter INV2, a level-up shifter 320, and a pass gate PASS2. The inverter INV2 inverts a phase of the test signal TM_BIAS to output a test bar signal TM_BIASB. The level-up shifter 320 outputs a test bar up signal TM_BIASB_UP having a voltage level higher than that of the activated test bar signal TM_BIASB by increasing the voltage level of the test bar signal TM_BIASB so as to interrupt the output of the second power supply voltage VPP. The pass gate PASS2 transfers the second power supply voltage VPP to the I/O pad 100B in response to the test signal TM_BIAS and the test bar up signal TM_BIASB_UP.

The reason why the level-up shifter 320 is provided is as follows. The pass gate PASS2 includes one pair of an NMOS transistor and a PMOS transistor. That is, when the test signal TM_BIAS and the test bar signal TM_BIASB are used as the control signals, the NMOS transistor receives the second power supply voltage VPP at a drain and outputs it at a source, and the PMOS transistor receives the second power supply voltage VPP at a source and outputs it at a drain. If the test signal TM_BIAS and the test bar signal TM_BIASB are respectively activated and deactivated and thus the second power supply voltage VPP is output, the NMOS transistor and the PMOS transistor are turned on with the sufficient voltage difference in the gate and source of the NMOS transistor and the gate and drain of the PMOS transistor. However, when the test signal TM_BIAS and the test bar signal TM_BIASB are respectively deactivated and activated and thus the output of the second power supply voltage VPP is interrupted, the NMOS transistor is turned off because the voltage difference between the gate and the source disappears, while the PMOS transistor is not turned off because the voltage difference between the gate and the source has a difference between the second power supply voltage VPP and the test bar signal TM_BIASB. Therefore, the level-up shifter 320 is used to increase the voltage level of the test bar signal TM_BIASB. That is, the pass gate PASS2 can be successfully controlled using the test bar up signal TM_BIASB_UP.

In the first embodiment of the present invention, the voltage output unit operates when the output internal voltages are in the range from the power supply voltage VDDQ and the ground voltage VSSQ. However, in the second embodiment of the present invention, the voltage output unit operates when the internal voltages are higher than the power supply voltage VDDQ under the condition that the test signal is in the range from the power supply voltage VDDQ and the ground voltage VSSQ.

Figure 5:
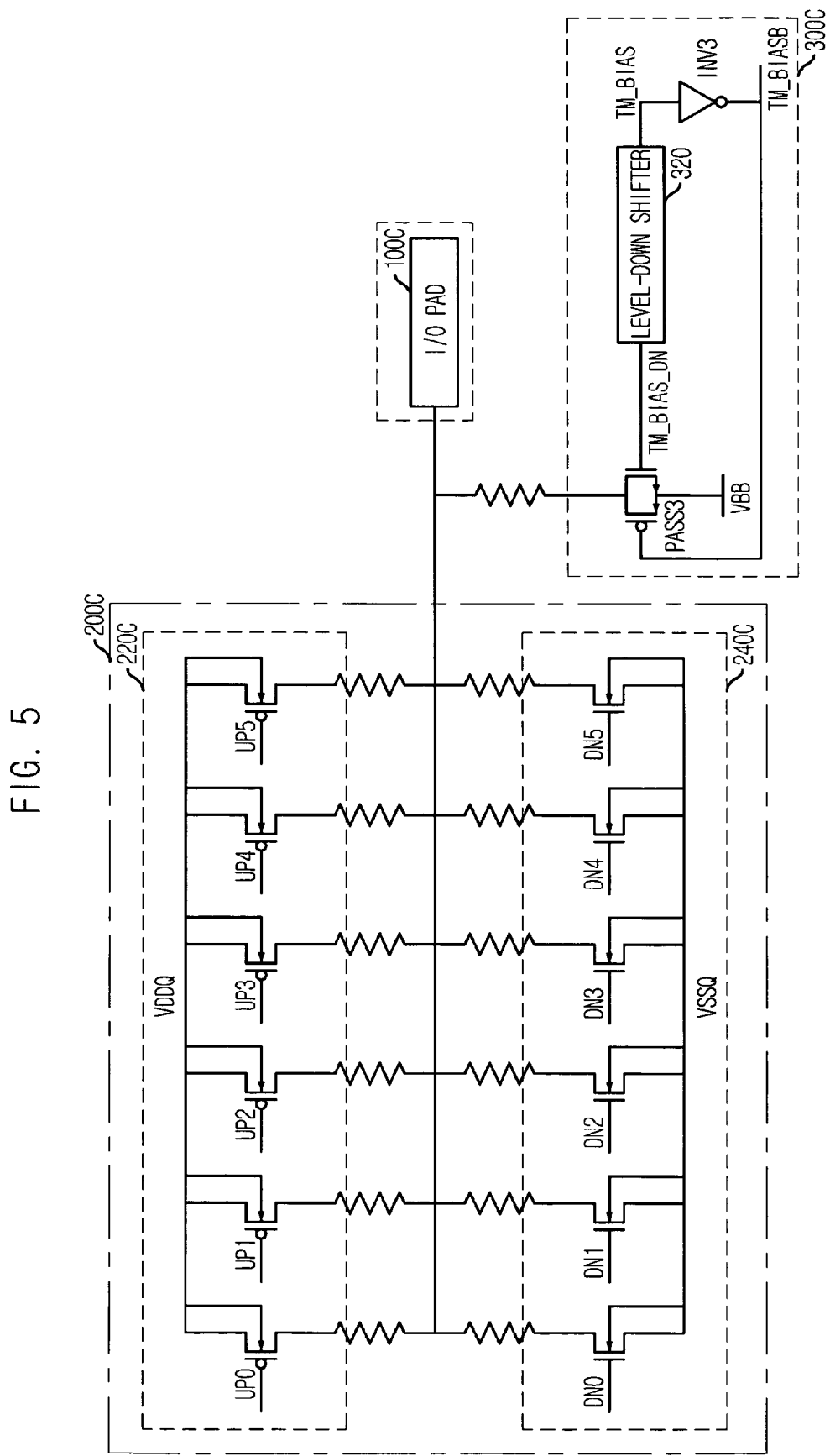
FIG. 5 is a detailed circuit diagram of an internal voltage measuring apparatus in accordance with a third embodiment of the present invention.

FIG. 5 is a detailed circuit diagram of an internal voltage measuring apparatus in accordance with a third embodiment of the present invention.

The internal voltage measuring apparatus includes an I/O pad 100C, a data output driving unit 200C, and a voltage output unit 300C. The data output driving unit 200C includes pull-up transistors 220C for pulling up an input voltage to a first voltage level VDDQ and pull-down transistors 240C for pulling down the input voltage to a second voltage level VSSQ in response to logic levels of the data input from the memory bank, and outputs the pulled-up or pulled-down voltage to the I/O pad 100C. The voltage output unit 300C connected to the data output driving unit 200C receives a third power supply voltage VBB lower than the second voltage level VSSQ and outputs it to the I/O pad 100C when the test signal TM_BIAS is activated.

The test signal TM_BIAS has the first voltage level VDDQ when it is activated, and has the second voltage level VSSQ when it is deactivated.

Since the operation of the data output driver 200C is identical to that of the first embodiment of the present invention, its detailed description will be omitted.

The voltage output unit 300C includes an inverter INV3, a level-down shifter 340, and a pass gate PASS3. The inverter INV3 inverts a phase of the test signal TM_BIAS to output a test bar signal TM_BIASB. The level-down shifter 340 outputs a test down signal TM_BIAS_DN having a voltage level lower than that of the activated test bar signal TM_BIASB by decreasing the voltage level of the test bar signal TM_BIASB so as to interrupt the output of the third power supply voltage VBB. The pass gate PASS3 transfers the third power supply voltage VBB to the I/O pad 100C in response to the test signal TM_BIAS and the test down signal TM_BIAS_DN.

The reason why the level-down shifter 340 is provided is as follows. The pass gate PASS3 includes one pair of an NMOS transistor and a PMOS transistor. That is, when the test signal TM_BIAS and the test bar signal TM_BIASB are used as the control signals, the NMOS transistor receives the third power supply voltage VBB at a source and outputs it at a drain, and the PMOS transistor receives the third power supply voltage VBB at a drain and outputs it at a source. If the test signal TM_BIAS and the test bar signal TM_BIASB are respectively activated and deactivated and thus the third power supply voltage VBB is output, the NMOS transistor and the PMOS transistor are turned on with the sufficient voltage difference in the gate and source of the NMOS transistor and the gate and drain of the PMOS transistor. However, when the test signal TM_BIAS and the test bar signal TM_BIASB are respectively deactivated and activated and thus the output of the third power supply voltage VBB is interrupted, the PMOS transistor is turned off because the voltage difference between the gate and the source disappears, while the NMOS transistor is not turned off because the voltage difference between the gate and the source has a difference between the third power supply voltage VBB and the test signal TM_BIAS. Therefore, the level-down shifter 340 is used to decrease the voltage level of the test signal TM_BIAS. That is, the pass gate PASS3 can be successfully controlled using the test bar down signal TM_BIAS_DN.

In the second embodiment of the present invention, the voltage output unit operates when the internal voltages are higher than the power supply voltage VDDQ under the condition that the test signal is in the range from the power supply voltage VDDQ and the ground voltage VSSQ. However, in the third embodiment of the present invention, the voltage output unit 300C operates when the internal voltages are lower than the ground voltage VSSQ under the condition that the test signal is in the range between the power supply voltage VDDQ and the ground voltage VSSQ.

The logic gates and transistors may be differently implemented according to the polarities of the input signals.

As described above, the internal voltages can be output even when the data output driving unit does not output the data and the test signal is activated. Moreover, the number of dummy pads can be reduced.

The present application contains subject matter related to Korean patent application Nos. 2005-91595 & 2006-44162, filed in the Korean Intellectual Property Office on Sep. 29, 2005 & May 17, 2006, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A semiconductor memory device, comprising a plurality of internal voltage measuring units, each for driving data input from a memory bank to output the data when a test signal is deactivated, and outputting a corresponding one of internal voltages used in the semiconductor memory device when the test signal is activated wherein each of the plurality of internal voltage measuring units includes:

an input/output (I/O) pad;

a data output driving unit for pulling up an input voltage to a first voltage level or pulling down the input voltage to a second voltage level in response to logic levels of the data input from the memory bank, and outputting the pulled-up or pull-down voltage to the I/O pad; and a voltage output unit, connected to the data output driving unit, for receiving the corresponding one of the internal voltages and outputting the corresponding internal voltage to the I/O pad when the test signal is activated, wherein the voltage output unit receives a first power supply voltage lower than the first voltage level and higher than the second voltage level, and outputs the first power supply voltage to the I/O pad when the test signal is activated.

2. The semiconductor memory device as recited in claim 1, wherein the test signal has the first voltage level when the test signal is activated, and has the second voltage level when the test signal is deactivated.

3. The semiconductor memory device as recited in claim 2, wherein the voltage output unit includes:

an inverter for inverting a phase of the test signal to output a test bar signal; and a pass gate for outputting the first power supply voltage to the I/O pad in response to the test signal and the test bar signal.

4. The semiconductor memory device as recited in claim 2, wherein the voltage output unit receives a second power supply voltage higher than the first voltage level, and outputs the second power supply voltage to the I/O pad when the test signal is activated.

5. The semiconductor memory device as recited in claim 4, wherein the voltage output unit includes:

an inverter for inverting a phase of the test signal to output a test bar signal;

a level-up shifter for increasing a voltage level of the test bar signal to output a test bar up signal, the test bar up signal having a voltage level higher than the second power supply voltage when the test bar up signal is activated; and a pass gate for outputting the second power supply voltage to the I/O pad in response to the test signal and the test bar up signal.

6. The semiconductor memory device as recited in claim 1, wherein the voltage output unit receives a third power supply voltage lower than the second voltage level, and outputs the third power supply voltage to the I/O pad when the test signal is activated.

7. The semiconductor memory device as recited in claim 6, wherein the voltage output unit includes:

an inverter for inverting a phase of the test signal to output a test bar signal;

a level-down shifter for decreasing a voltage level of the test signal to output a test down signal, the test down signal having a voltage level lower than the third power supply voltage when the test down signal is deactivated; and a pass gate for outputting the third power supply voltage to the I/O pad in response to the test signal and the test down signal.

8. An internal voltage measuring apparatus of a semiconductor memory device, comprising:

an input/output (I/O) pad;

a data output driving unit configured to pull up an input voltage to a first voltage level or pull down the input voltage to a second voltage level in response to logic levels of the data input from a memory bank, and to output the pulled-up or pull-down voltage to the I/O pad; and a voltage output unit, connected to the data output driving unit, configured to receive one of internal voltages and to output the received internal voltage to the I/O pad when a test signal is activated, wherein the voltage output unit receives a first power supply voltage lower than the first voltage level and higher than the second voltage level, and outputs the first power supply voltage to the I/O pad when the test signal is activated.

9. The internal voltage measuring apparatus of claim 8, wherein the voltage output unit includes:

an inverter for inverting a phase of the test signal to output a test bar signal; and a pass gate for outputting the first power supply voltage to the I/O pad in response to the test signal and the test bar signal.

10. An internal voltage measuring apparatus for a memory device, comprising:

an input/output (I/O) pad;

a data output driving unit configured to pull up an input voltage to a first voltage level or pull down the input voltage to a second voltage level in response to logic levels of data input from a memory bank, and to output the pull-up or pull-down voltage to the I/O pad; and a voltage output unit, connected to the data output driving unit, for configured to receive a second power supply voltage higher than the first voltage level, and to output the second power supply voltage to the I/O pad when a test signal is activated, wherein the voltage output unit includes:

an inverter configured to invert a phase of the test signal to output a test bar signal;

a level-up shifter configured to increase a voltage level of the test bar signal to output a test bar up signal, the test bar up signal having a voltage level higher than the second power supply voltage when the test bar up signal is activated; and a pass gate configured to output the second power supply voltage to the I/O pad in response to the test signal and the test bar up signal.

11. The internal voltage measuring apparatus of claim 10, wherein the test signal has the first voltage level when the test signal is activated, and has the second voltage level when the test signal is deactivated.

12. An internal voltage measuring apparatus for a memory device, comprising:

an input/output (I/O) pad;

a data output driving unit configured to pull up an input voltage to a first voltage level or pull down the input voltage to a second voltage level in response to logic levels of data input from a memory bank, and to output the pull-up or pull-down voltage to the I/O pad; and a voltage output unit, connected to the data output driving unit, to receive a third power supply voltage lower than the second voltage level, and to output the third power supply voltage to the I/O pad when a test signal is activated, wherein the voltage output unit includes:

an inverter configured to invert a phase of the test signal to output a test bar signal;

a level-down shifter configured to decrease a voltage level of the test signal to output a test down signal, the test down signal having a voltage level lower than the third power supply voltage when the test down signal is deactivated; and a pass gate configured to output the third power supply voltage to the I/O pad in response to the test signal and the test down signal.

13. The internal voltage measuring apparatus of claim 12, wherein the test signal has the first voltage level when the test signal is activated, and has the second voltage level when the test signal is deactivated.

* * * * *